(12) United States Patent
Bebenroth et al.

(10) Patent No.: US 9,765,236 B2
(45) Date of Patent: Sep. 19, 2017

(54) ONE-COMPONENT, SOLVENT-FREE ORGANOSILOXANE COMPOSITION FOR APPLICATION TO PRINTED CIRCUIT BOARDS BY MEANS OF A CROSS-CUT NOZZLE

(71) Applicant: ELANTAS GmbH, Wesel (DE)

(72) Inventors: Kim Bastian Bebenroth, Hamburg (DE); Andreas Steinmann, Hamburg (DE); Gerold Schmidt, Hamburg (DE)

(73) Assignee: ELANTAS GmbH, Wesel (DE)

( * ) Notice: Subject to any disclaimer, the term of this patent is extended or adjusted under 35 U.S.C. 154(b) by 612 days.

(21) Appl. No.: 14/208,388

(22) Filed: Mar. 13, 2014

(65) Prior Publication Data
US 2014/0315032 A1 Oct. 23, 2014

(30) Foreign Application Priority Data

Apr. 19, 2013 (DE) .................. 10 2013 207 077

(51) Int. Cl.
C09D 183/04 (2006.01)
H05K 3/46 (2006.01)
H05K 3/28 (2006.01)
C08L 83/04 (2006.01)
H05K 1/03 (2006.01)

(52) U.S. Cl.
CPC ............ C09D 183/04 (2013.01); C08L 83/04 (2013.01); H05K 3/285 (2013.01); H05K 3/46 (2013.01); H05K 1/0326 (2013.01); H05K 2201/0162 (2013.01); H05K 2201/09827 (2013.01); Y10T 428/31663 (2015.04)

(58) Field of Classification Search
CPC ....... C09D 183/04; C08L 83/04; H05K 3/285; H05K 3/46
See application file for complete search history.

(56) References Cited

U.S. PATENT DOCUMENTS

| 5,082,894 A | 1/1992 | VanWert et al. |
| 5,194,460 A | 3/1993 | Evans et al. |
| 5,270,425 A | 12/1993 | Vanwert et al. |
| 2009/0068475 A1 | 3/2009 | Bosshammer |
| 2011/0251321 A1* | 10/2011 | Zhu ........................ C08L 83/04 524/314 |

FOREIGN PATENT DOCUMENTS

| DE | 69222137 T2 | 4/1998 |
| DE | 69418427 T2 | 10/1999 |
| DE | 102005014289 A1 | 9/2006 |
| EP | 0653463 A2 | 5/1995 |

* cited by examiner

Primary Examiner — Catherine S Branch
(74) Attorney, Agent, or Firm — Birch, Stewart, Kolasch & Birch, LLP

(57) ABSTRACT

One-component, solvent-free organosiloxane composition comprising
a) a linear or branched polyorganosiloxane containing at least two alkenyl or alkynyl groups, as component A;
b) a linear or branched polyorganosiloxane containing at least 3 Si—H groups, as component B;
c) a hydrosilylation catalyst as component C;
d) an alkynol of the general formula (I)

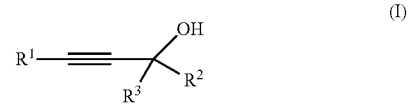

wherein
$R^1, R^2, R^3$ are selected independently of one another from H, $C_1$-$C_6$-alkyl and substituted or unsubstituted $C_3$-$C_6$-alkyl; or
$R^1$ is selected from H, $C_1$-$C_6$-alkyl and substituted or unsubstituted $C_3$-$C_6$-cycloalkyl, and $R^2$, $R^3$ are bonded together and form a 3- to 8-membered ring which can be substituted by one or more $C_1$-$C_3$-alkyl groups, as component D; and
e) a fumed silica as component E.

23 Claims, No Drawings

ONE-COMPONENT, SOLVENT-FREE ORGANOSILOXANE COMPOSITION FOR APPLICATION TO PRINTED CIRCUIT BOARDS BY MEANS OF A CROSS-CUT NOZZLE

The invention relates to one-component, solvent-free organosiloxane compositions comprising fumed silica and alkynol, to the use thereof for applying organosiloxane protective coatings to printed circuit boards by means of a cross-cut nozzle, as well as to organosiloxane protective coatings as such.

Electrical and electronic components, in particular printed circuit boards, are becoming smaller from year to year, in order to permit higher packing densities. Premature failure of such components due to moisture, dirt and thermal and mechanical stress can be prevented by means of protective lacquers or coatings. Ever greater demands are being made of the lacquering or coating processes. In many cases, as well as permitting uniform layer thicknesses and reproducible coating results, they must also permit selective lacquer application.

Contact regions, plug connectors, mechanical components or the like must not be wetted by the protective coating because this would adversely affect their functionality. In addition, unevenly applied protective coatings, in particular accumulations of coating material at the corners and edges of components, can make subsequent assembly considerably more difficult. Conventional lacquering or coating processes can often satisfy this requirement only inadequately.

In addition to the conventional coating or lacquering processes, a coating process in which the protective coating can be applied without compressed air ("airless") has become established in the recent past, in particular in the coating of printed circuit boards. This lacquering or coating process—called the airless process hereinbelow—is distinguished in particular by the fact that the lacquer can be applied without spray mist and with precise edge definition. Unlike conventional coating processes, in which the coating material is atomized by means of compressed air and spray mist inevitably forms, the occurrence of spray mist is prevented in the airless process by the use of a special coating head.

That coating head has a nozzle, the opening of which has the shape of a cross-cut. On account of its shape, the nozzle is frequently referred to as a cross-cut nozzle. When the coating material is pressed through this cross-cut nozzle, a coating curtain from several millimetres to several centimetres wide is produced—at least within certain pressure limits—without the formation of spray mist. This enables the coating material to be applied to precisely defined points on the surface of the component. In addition, the airless process ensures that uniform layer thicknesses are applied. Moreover, the process also has economic advantages. For example, it permits improved material utilization because nothing is lost through spray mist.

It is a precondition, however, that the coating material used in the process has suitable viscosity properties. It is crucial that the viscosity of the coating material as it passes through the cross-cut nozzle has a shear viscosity of not more than 120 mPa·s. At a higher shear viscosity, the coating curtain frequently does not open or does not remain stable. The result is that the coating material leaves the cross-cut nozzle in an undefined jet or in the form of drops. Both are unsuitable for the coating of many electrical and electronic components, in particular printed circuit boards.

If the viscosity of the coating material is too low, there is the risk that the coating material will run after it has been applied to the electrical or electronic component, which can lead to the layer thickness becoming unevenly thick or areas of the component that are not to be coated being covered with coating material. In order to prevent this, the coating mass should have a high viscosity. In addition, the coating mass must not spread after application and become distributed extensively over the surface of the component. These problems can frequently be prevented by using coating masses of high viscosity. In the case of organosiloxane compositions, the viscosity should be at least 5000 mPa·s.

A more comprehensive description of that airless process using a cross-cut nozzle is to be found in Cross-Cut Airless Spray Gun Nozzles, 2011, Nordson Corporation.

One-component, solvent-free organosiloxane compositions are known in principle. Their use for applying a protective coating to electronic and electrical components is also known. The organosiloxane compositions are first applied to the grease- and dirt-free electronic or electrical components by means of generally known conventional processes and are subsequently cured at temperatures between 100 and 150° C., whereby the organosiloxane protective coating is then formed.

A one-component, solvent-free organosiloxane composition with good adhesion to electrical and electronic components is described in EP 0 510 608 A. The composition comprises a divinylpolyorganosiloxane (A), an organosiloxane having at least 3 silicon-bonded hydrogen atoms (B), a hydrosilylation catalyst based on platinum (C), a polyorganosiloxane having a silicon-bonded hydroxy substituent and a silicon-bonded vinyl substituent (D), an adhesion promoter (E), as well as an alkynol (F) which ensures that the one-component composition remains stable to storage over several months.

U.S. Pat. No. 5,082,894 A discloses a one-component, solvent-free organosiloxane mixture with good adhesion, which comprises a liquid polydiorganosiloxane having at least two silicon-bonded alkenyl groups (A), an organohydrogensiloxane having on average at least 3 silicon-bonded hydrogen atoms per molecule (B), a platinum-based hydrosilylation catalyst (C), an alkynol having at least 8 carbon atoms as catalyst inhibitor (D), as well as an adhesion promoter mixture (E). The viscosity of this one-component, solvent-free organosiloxane mixture is from 300 to 500 mPa·s. Curing of the organosiloxane mixture takes place at temperatures below 150° C.

U.S. Pat. No. 5,270,425 A likewise describes a one-component, solvent-free organosiloxane mixture with good adhesion, which comprises a liquid polydiorganosiloxane having at least two silicon-bonded alkenyl groups (A), a polyorganosiloxane having at least two silicon-bonded hydrogen atoms per molecule (B), a platinum-based hydrosilylation catalyst (C), an adhesion promoter mixture comprising a chelated aluminium complex (D), and an alkynol having not more than 6 carbon atoms (E).

Owing to their low viscosity of not more than 500 mPa·s, those organosiloxane mixtures are not suitable for use in the above-described process in which the coating material is applied to the electrical and electronic components by means of a cross-cut nozzle. Owing to their lack of structural viscosity, they would run after being applied to the component. In addition, curing of those organosiloxane mixtures generally takes place at over 100° C. and/or with curing times of more than 10 minutes. However, because electronic components are frequently very sensitive to temperature, the organosiloxane mixture should already be cured after 10 minutes at not more than 100° C.

The object of the invention is, therefore, to provide a one-component, solvent-free organosiloxane composition which is suitable for application to electrical or electronic components, in particular printed circuit boards, by means of a cross-cut nozzle. The one-component, solvent-free organosiloxane composition is not to run after application. At the same time, the one-component, solvent-free organosiloxane compositions are to have storage stabilities of at least 4 months and are to cure as a thin film within 10 minutes at 100° C.

The object is achieved by a one-component, solvent-free organosiloxane composition comprising
a) from 10 to 98% by weight of at least one linear or branched polyorganosiloxane containing at least two alkenyl or alkynyl groups, as component A;
b) from 0.1 to 30% by weight of at least one linear or branched polyorganosiloxane containing at least 3 Si—H groups, as component B;
c) from 0.000001 to 1% by weight of at least one hydrosilylation catalyst as component C;
d) from 0.00001 to 5% by weight of at least one alkynol of the general formula (I)

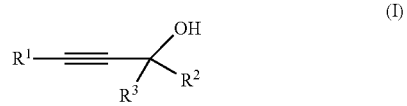

wherein
$R^1$, $R^2$, $R^3$ are selected independently of one another from H, $C_1$-$C_6$-alkyl and substituted or unsubstituted $C_3$-$C_6$-cycloalkyl; or
$R^1$ is selected from H, $C_1$-$C_6$-alkyl and substituted or unsubstituted $C_3$-$C_6$-cycloalkyl, and $R^2$, $R^3$ are bonded together and form a 3- to 8-membered ring which can be substituted by one or more $C_1$-$C_3$-alkyl groups, as component D;
e) from 0.1 to 10% by weight of at least one fumed silica as component E;
f) from 0 to 89.799989% by weight of one or more polyorganosiloxanes containing two terminal Si—H groups or one terminal Si—H group and one terminal alkenyl group, as component F;
g) from 0 to 20% by weight of one or more polyepoxyorganosiloxanes as component G;
h) from 0 to 30% by weight of one or more acyclic or cyclic organosiloxanes other than component A, having from 1 to 5 Si atoms and containing at least two alkenyl groups, as component H; and
i) from 0 to 10% by weight of one or more additives as component I;
wherein the sum of components A to I is 100% by weight.

Surprisingly, it has been found that the organosiloxane composition does not run after application to an electrical or electronic component by means of a cross-cut nozzle if, as well as comprising a fumed silica, it also comprises an alkynol of the general formula (I).

Although an organosiloxane composition comprising components A, B and C can be adjusted, by suitably choosing the mixing ratio, so that the shear viscosity is sufficiently low to apply the composition to an electrical or electronic component by means of a cross-cut nozzle, the composition then runs after application owing to its low viscosity. Running after application is particularly pronounced in the case of organosiloxane compositions in particular owing to the good wetting properties of siloxanes. By adding known rheology additives, such as, for example, a fumed silica, it is in principle possible to increase the viscosity so that running would be suppressed, but it would no longer be possible to apply that organosiloxane composition by means of a cross-cut nozzle owing to its high viscosity. The amount of known rheology additives that can be added is therefore possible to only a limited extent in the case of these compositions. The addition of known rheology additives alone therefore does not achieve the object according to the invention.

Surprisingly, the addition of small amounts of an alkynol of the general formula (I) has the result that the structural viscosity of the organosiloxane composition is influenced positively as regards its suitability for application to electrical or electronic components by means of a cross-cut nozzle.

Within the context of the present invention, structural viscosity means the property of a fluid of exhibiting a decreasing viscosity at high shear forces. That is to say, the higher the shear rate, the lower the viscosity. The decrease in viscosity can be attributed to a structural change in the fluid which allows the individual constituents of the fluid—such as, for example, polymers—to slide past one another with lower friction.

By the addition of small amounts of an alkynol of the general formula (I), a viscosity of 120 mPa·s or less at a shear rate of 1000 s$^{-1}$ can be achieved. This viscosity is low enough to allow the organosiloxane composition to be applied by means of a cross-cut nozzle at a suitable nozzle pressure. In addition, the viscosity at low shear rates is sufficiently high to suppress running after application to an electrical or electronic component. At shear rates of 0.01 s$^{-1}$ or less, the viscosity is generally at least 5000 mPa·s.

The one-component, solvent-free organosiloxane composition according to the invention can be cured by heating at temperatures of 50° C. or more. At a temperature of 100° C., a thin film of the composition cures within 10 minutes to form a touch-dry protective coating.

Within the context of the present invention, a thin film is to be understood as being a fluid layer having a layer thickness of from 0.1 to 250 μm.

Curing of the one-component, solvent-free organosiloxane composition is initiated by the liberation of the hydrosilylation catalyst at temperatures of 50° C. or more and the simultaneous evaporation of the inhibitor, which effects crosslinking of the siloxanes by hydrosilylation.

The one-component, solvent-free organosiloxane composition is generally stable to storage over a period of at least 4 months, preferably at least 6 months. This means that premature crosslinking of the organosiloxanes and a reduction in the catalytic activity of the hydrosilylation catalyst are not to be observed within that period of time.

The shear viscosity of the one-component, solvent-free organosiloxane composition is generally not more than 120 mPa·s at a shear rate of 1000 s$^{-1}$ and at least 5000 mPa·s at a shear rate of 0.01 s$^{-1}$. Preferably, the shear viscosity of the organosiloxane composition is not more than 120 mPa·s at a shear rate of 600 s$^{-1}$ and at least 8000 mPa·s at a shear rate of 0.01 s$^{-1}$.

Within the context of the present invention, the term "viscosity" is always to be understood as meaning the dynamic viscosity (η), which has the unit N·s·m$^{-2}$=Pa·s or mN·s·m$^{-2}$=mPa·s.

The term "shear viscosity" is synonymous with the term "viscosity". The term "shear viscosity" is used instead of the term "viscosity" in particular when the stated viscosity relates to a specific shear rate. This is simply to clarify that the viscosity changes in dependence on the shear rate.

The viscosity can be determined by a large number of methods known to the person skilled in the art. For example, the dynamic viscosity can be determined with the aid of a capillary viscometer, a falling-body viscometer or a rotational rheometer. A comprehensive description of the determination of the viscosity is to be found in Meichsner, G./Mezger, T. G./Schröder, J. (1997) Lackeigenschaften messen and steuern. In Zorll, U. (ed.), Rheometrie (p. 50-81). Hanover: Vincenz. The viscosities mentioned in connection with the present invention were all determined using an oscillatory/rotational rheometer (type: MCR-302 from Anton Paar).

All the viscosities listed in this application relate to room temperature (23° C.), unless expressly stated otherwise.

The one-component, solvent-free organosiloxane composition (called the composition according to the invention hereinbelow) comprises as component A preferably at least one linear polyorganosiloxane containing at least two alkenyl groups. The alkenyl groups are preferably vinyl groups, particularly preferably terminal vinyl groups.

In a preferred embodiment, the composition according to the invention comprises as component A at least one linear polyorganosiloxane of the general formula (IV)

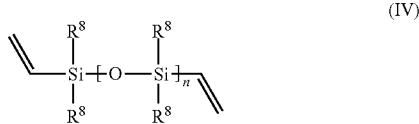

(IV)

wherein
$R^8$ is selected independently from $C_1$-$C_6$-alkyl; and
n is a number from 6 to 1000.

In a particularly preferred embodiment, the composition according to the invention comprises as component A at least one linear polyorganosiloxane of the general formula (IV) wherein $R^8$ is methyl.

Within the context of the present invention, the expression "$C_1$-$C_6$-alkyl" means the following group of alkyl groups: methyl, ethyl, n-propyl, isopropyl, n-butyl, isobutyl, sec-butyl, tert-butyl, n-pentyl, 3-methylbutyl, 2-methylbutyl, 1-methylbutyl, 1-ethyl-propyl, n-hexyl, 4-methylpentyl, 3-methylpentyl, 2-methylpentyl, 1-methylpentyl, 2-ethylbutyl, 1-ethylbutyl, 1,1-dimethylbutyl, 1,2-dimethylbutyl, 1,3-dimethylbutyl, 2,2-dimethylbutyl, 2,3-dimethylbutyl, 3,3-dimethylbutyl, 1,1,2-trimethylpropyl, 1,2,2-trimethylpropyl, 1-ethyl-1-methylpropyl, 1-ethyl-2-methylpropyl.

The composition according to the invention comprises preferably from 10 to 98% by weight, particularly preferably from 20 to 98% by weight, most particularly preferably from 30 to 98% by weight, of component A.

The viscosity of the polyorganosiloxane according to component A is generally between 1 and 10,000 mPa·s. The viscosity is preferably between 1 and 1000 mPa·s, particularly preferably between 1 and 200 mPa·s.

The composition according to the invention comprises as component B preferably at least one linear or branched polyorganosiloxane containing at least 3 Si—H groups. Preferably, the composition according to the invention comprises as component B at least one linear polydimethylsiloxane containing at least 3 Si—H groups.

The composition according to the invention comprises preferably from 0.1 to 30% by weight, particularly preferably from 0.2 to 15% by weight, particularly preferably from 1 to 15% by weight, of component B.

The viscosity of the polyorganosiloxane according to component B is generally between 1 and 1000 mPa·s, preferably between 1 and 100 mPa·s and particularly preferably between 5 and 50 mPa·s.

The composition according to the invention comprises as component C preferably a hydrosilylation catalyst based on a platinum group metal. Within the context of the present invention, the term "platinum group metals" is to be understood as meaning the metals ruthenium, rhodium, palladium, osmium, iridium and platinum. Hydrosilylation catalysts based on platinum are preferred. Further preferred hydrosilylation catalysts are platinum-alkenylsiloxane catalysts. Particularly preferably, the hydrosilylation catalyst is selected from the group consisting of the platinum-1,3-divinyl-1,1,3,3-tetramethyldisiloxane complex (Karstedt complex), the platinum-1,3-diallyl-1,1,3,3-tetramethyldisiloxane complex, the platinum-1,3-divinyl-1,3-dimethyl-1,3-diphenyldisiloxane complex, the platinum-1,1,3,3-tetraphenyldisiloxane complex and the platinum-1,3,5,7-tetramethyl-1,3,5,7-tetravinylcyclotetra-siloxane complex. The hydrosilylation catalyst is most particularly preferably the platinum-1,3-divinyl-1,1,3,3-tetramethyldisiloxane complex (Karstedt complex).

The composition according to the invention comprises preferably from 0.000001 to 1% by weight, particularly preferably from 0.0005 to 1% by weight, most particularly preferably from 0.001 to 0.5% by weight, of component C.

The composition according to the invention comprises as component D preferably at least one alkynol of the general formula (I) wherein $R^1$, $R^2$, $R^3$ are selected independently of one another from H, $C_1$-$C_6$-alkyl and substituted or unsubstituted $C_3$-$C_6$-cycloalkyl.

Within the context of the present invention, the expression "$C_3$-$C_6$-cycloalkyl" means the following group of cycloalkyl groups: cyclopropyl, cyclobutyl, cyclopentyl, cyclohexyl.

The composition according to the invention comprises as component D particularly preferably at least one alkynol of the general formula (I) wherein $R^1$=H, $R^2$=methyl and $R^3$ is selected from $C_1$-$C_6$-alkyl. Most particularly preferably, the composition according to the invention comprises as component D at least one alkynol selected from 2-methyl-3-butyn-2-ol and 3,5-dimethyl-1-hexyn-3-ol.

The composition according to the invention comprises preferably from 0.00001 to 5% by weight, particularly preferably from 0.001 to 3% by weight, most particularly preferably from 0.01 to 2% by weight, of component D.

The composition according to the invention comprises as component E preferably a hydrophobic fumed silica.

Within the context of the present invention, the expression "hydrophobic fumed silica" is to be understood as meaning a fumed silica treated with organosilanes which, compared with the untreated fumed silica, has a smaller number of silanol groups on the surface. Such hydrophobic fumed silicas are known to the person skilled in the art and are described, for example, in DE 699 22 557 and the literature cited therein.

The composition according to the invention comprises preferably from 0.1 to 10% by weight, particularly preferably from 0.1 to 5% by weight, most particularly preferably from 0.1 to 4% by weight, of component E.

It has also been found that the structural viscosity of the composition according to the invention can be influenced by the addition of polyorganosiloxanes according to component F containing two terminal Si—H groups or one terminal Si—H group and one terminal alkenyl group. Likewise, the structural viscosity can also be influenced by the addition of polyepoxyorganosiloxanes according to component G.

Accordingly, a preferred embodiment of the composition according to the invention comprises from 0.0001 to 89.799989% by weight of component F.

The composition according to the invention comprises particularly preferably from 10 to 79.6985% by weight and most particularly preferably from 20 to 68.889% by weight of component F.

Particularly preferably, the composition according to the invention comprises as component F one or more polyorganosiloxanes of the general formula (II)

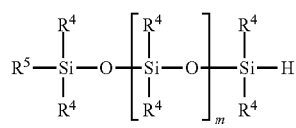

(II)

wherein
$R^4$ is selected independently from $C_1$-$C_6$-alkyl,
$R^5$ is selected from H and $C_2$-$C_6$-alkenyl, and
m is a number from 1 to 400.
$R^4$ is preferably methyl.
$R^5$ is preferably H or vinyl.
m is preferably a number from 2 to 400.

Within the context of the present invention, the expression "$C_2$-$C_6$-alkenyl" means the following group of alkenyl groups: vinyl, allyl, methallyl, 1-methylallyl, homoallyl, cis-but-2-enyl, trans-but-2-enyl, cis-pent-1-enyl, trans-pent-1-enyl, cis-pent-2-enyl, trans-pent-2-enyl, cis-pent-3-enyl, trans-pent-3-enyl, cis-1-methylbut-1-enyl, trans-1-methylbut-1-enyl, cis-2-methylbut-1-enyl, trans-2-methylbut-1-enyl, cis-3-methylbut-1-enyl, trans-3-methylbut-1-enyl, cis-1-methylbut-2-enyl, trans-1-methylbut-2-enyl, cis-2-methylbut-2-enyl, trans-2-methylbut-2-enyl, 3-methylbut-2-enyl, 1-methylbut-3-enyl, 2-methylbut-3-enyl, 3-methylbut-3-enyl, cis-1-ethylprop-1-enyl, trans-1-ethylprop-1-enyl, 1-ethyl-prop-2-enyl, cis-hex-1-enyl, trans-hex-1-enyl, cis-hex-2-enyl, trans-hex-2-enyl, cis-hex-3-enyl, trans-hex-3-enyl, cis-hex-4-enyl, trans-hex-4-enyl, hex-5-enyl, cis-1-methylpent-1-enyl, trans-1-methylpent-1-enyl, cis-2-methylpent-1-enyl, trans-2-methylpent-1-enyl, cis-3-methylpent-1-enyl, trans-3-methylpent-1-enyl, cis-4-methylpent-1-enyl, trans-4-methylpent-1-enyl, cis-1-methylpent-2-enyl, trans-1-methylpent-2-enyl, cis-2-methylpent-2-enyl, trans-2-methylpent-2-enyl, cis-3-methylpent-2-enyl, trans-3-methylpent-2-enyl, cis-4-methylpent-2-enyl, trans-4-methylpent-2-enyl, cis-1-methylpent-3-enyl, trans-1-methylpent-3-enyl, cis-2-methylpent-3-enyl, trans-2-methylpent-3-enyl, cis-3-methylpent-3-enyl, trans-3-methylpent-3-enyl, 4-methylpent-3-enyl, 1-methylpent-4-enyl, 2-methylpent-4-enyl, 3-methylpent-4-enyl, 4-methylpent-4-enyl, cis-1,2-dimethylbut-1-enyl, trans-1,2-dimethylbut-1-enyl, cis-1,3-dimethylbut-1-enyl, trans-1,3-dimethylbut-1-enyl, cis-3,3-dimethylbut-1-enyl, trans-3,3-dimethylbut-1-enyl, cis-1,1-dimethylbut-2-enyl, trans-1,1-dimethylbut-2-enyl, cis-1,2-dimethylbut-2-enyl, trans-1,2-dimethylbut-2-enyl, cis-1,3-dimethylbut-2-enyl, trans-1,3-dimethylbut-2-enyl, cis-2,3-dimethylbut-2-enyl, trans-2,3-dimethylbut-2-enyl, 1,1-dimethylbut-3-enyl, 1,2-dimethylbut-3-enyl, 1,3-dimethylbut-3-enyl, 2,2-dimethylbut-3-enyl, 2,3-dimethylbut-3-enyl.

The viscosity of the polyorganosiloxane according to component F is generally between 1 and 10,000 mPa·s, preferably between 10 and 1000 mPa·s and particularly preferably between 10 and 50 mPa·s.

A further preferred embodiment of the present invention is a one-component, solvent-free organosiloxane composition comprising
a) from 10 to 98% by weight of component A;
b) from 0.1 to 30% by weight of component B;
c) from 0.000001 to 1% by weight of component C;
d) from 0.00001 to 5% by weight of component D;
e) from 0.1 to 10% by weight of component E;
f) from 0.0001 to 89.799989% by weight of component F; and
i) from 0 to 10% by weight of one or more additives as component I;
wherein the sum of components A to F and I is 100% by weight.

Another preferred embodiment of the composition according to the invention comprises from 0.0001 to 20% by weight of component G.

Particularly preferably, the composition according to the invention comprises as component G one or more polyepoxyorganosiloxanes of the general formula (III)

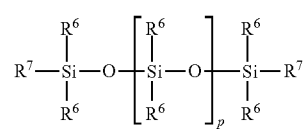

(III)

wherein
$R^6$ is selected independently from $C_1$-$C_6$-alkyl and substituted or unsubstituted $C_6$-$C_{12}$-aryl,
$R^7$ is selected from substituted or unsubstituted glycidyloxy-$C_1$-$C_{20}$-alkyl and substituted or unsubstituted glycidyloxy-$C_6$-$C_{12}$-aryl; and
p is a number from 1 to 2000.
$R^6$ is preferably methyl.
$R^7$ is preferably glycidyloxypropyl.
p is preferably a number from 2 to 2000.

The composition according to the invention comprises preferably from 0.0001 to 20% by weight, particularly preferably from 0.005 to 10% by weight, most particularly preferably from 0.01 to 5% by weight, of component G.

The viscosity of the polyepoxyorganosiloxanes according to component G is generally between 1 and 100,000 mPa·s.

Another further preferred embodiment of the present invention is a one-component, solvent-free organosiloxane composition comprising
a) from 10 to 98% by weight of component A;
b) from 0.1 to 30% by weight of component B;
c) from 0.000001 to 1% by weight of component C;
d) from 0.00001 to 5% by weight of component D;
e) from 0.1 to 10% by weight of component E;
g) from 0.0001 to 20% by weight of component G; and
i) from 0 to 10% by weight of one or more additives as component I;
wherein the sum of components A to E, G and I is 100% by weight.

In a particularly preferred embodiment of the composition according to the invention, it comprises both from 0.0001 to 88.799789% by weight of component F and from 0.0001 to 20% by weight of component G.

A further particularly preferred embodiment of the present invention is a one-component, solvent-free organosiloxane composition comprising
  a) from 10 to 98% by weight of component A;
  b) from 0.1 to 30% by weight of component B;
  c) from 0.000001 to 1% by weight of component C;
  d) from 0.00001 to 5% by weight of component D;
  e) from 0.1 to 10% by weight of component E;
  f) from 0.0001 to 89.799789% by weight of component F;
  g) from 0.0001 to 20% by weight of component G; and
  i) from 0 to 10% by weight of one or more additives as component I;
  wherein the sum of components A to G and I is 100% by weight.

It has further been found that the structural viscosity of the composition according to the invention can further be influenced if, in addition to component F and/or component G, there are also added from 0.0001 to 30% by weight of one or more acyclic or cyclic organosiloxanes other than component A, having from 1 to 5 Si atoms and containing at least two alkenyl groups.

Accordingly, a particularly preferred embodiment of the composition according to the invention comprises from 0.0001 to 30% by weight of one or more acyclic or cyclic organosiloxanes other than component A, having from 1 to 5 Si atoms and containing at least two alkenyl groups, as component H.

Particularly preferably, the composition according to the invention comprises as component H one or more siloxanes selected from the group consisting of 1,2-divinyltetramethyldisiloxane and 1,2,3,4-tetramethyl-1,2,3,4-tetravinyldimethyltricyclosiloxane.

The composition according to the invention comprises preferably from 0.0001 to 30% by weight, particularly preferably from 0.001 to 3% by weight, most particularly preferably from 0.01 to 1% by weight, of component H.

The molar ratio of Si—H groups to Si-alkenyl groups in the composition according to the invention is from 0.3 to 5, preferably from 0.5 to 2, particularly preferably from 0.8 to 1.5.

A further particularly preferred embodiment of the present invention is a one-component, solvent-free organosiloxane composition comprising
  a) from 10 to 98% by weight of component A;
  b) from 0.1 to 30% by weight of component B;
  c) from 0.000001 to 1% by weight of component C;
  d) from 0.00001 to 5% by weight of component D;
  e) from 0.1 to 10% by weight of component E;
  g) from 0.0001 to 20% by weight of component G; and
  h) from 0.0001 to 30% by weight of component H; and
  i) from 0 to 10% by weight of one or more additives as component I;
  wherein the sum of components A to E, G, H and I is 100% by weight.

A further particularly preferred embodiment of the present invention is a one-component, solvent-free organosiloxane composition comprising
  a) from 10 to 98% by weight of component A;
  b) from 0.1 to 30% by weight of component B;
  c) from 0.000001 to 1% by weight of component C;
  d) from 0.00001 to 5% by weight of component D;
  e) from 0.1 to 10% by weight of component E;
  f) from 0.0001 to 89.799789% by weight of component F;
  h) from 0.0001 to 30% by weight of component H; and
  i) from 0 to 10% by weight of one or more additives as component I;
  wherein the sum of components A to F, H and I is 100% by weight.

In addition to components A to H, the composition according to the invention can comprise one or more additives as component I. Special mention may be made in this connection of conventional additives such as pigments, colourants, adhesion promoters, flame retardants or UV stabilizers, UV fluorescent markers.

The composition according to the invention comprises preferably from 0 to 10% by weight, particularly preferably from 0 to 10% by weight and most particularly preferably from 0 to 8% by weight, of component I.

The present invention also provides a method for applying an organosiloxane protective coating to an electrical or electronic component, comprising the steps
  a) providing a one-component, solvent-free organosiloxane composition as defined above,
  b) applying the organosiloxane composition to an electrical or electronic component by means of a cross-cut nozzle, and
  c) heating the electrical or electronic component coated with the organsiloxane composition to a temperature of from 50 to 110° C., whereby the organosiloxane protective coating is formed on the electrical or electronic component by hydrosilylation reaction.

Preferably, application of the one-component, solvent-free organosiloxane component by means of the cross-cut nozzle in step b) takes place at a nozzle pressure between 0.7 and 4.2 bar. Particularly preferably, the application takes place at a nozzle pressure between 1.0 and 3.0 bar, most particularly preferably between 1.5 and 2.5 bar.

In the method according to the invention, the one-component, solvent-free organosiloxane composition is preferably applied in such a manner that an organosiloxane protective coating having a layer thickness of from 0.1 to 250 μm forms.

The method according to the invention is particularly suitable for the application of an organosiloxane protective coating to a printed circuit board. In a preferred embodiment of the method according to the organosiloxane composition is applied in step b) to a printed circuit board.

The present invention also provides the use of a one-component, solvent-free organosiloxane composition, as defined above, for applying an organosiloxane protective coating to an electrical or electronic component, preferably a printed circuit board, by means of a cross-cut nozzle.

The invention further provides an organosiloxane protective coating obtainable by the method according to the invention.

Preferably, the organosiloxane protective coating has a layer thickness of from 0.1 to 250 μm.

The present invention additionally provides an electrical or electronic component with the organosiloxane protective coating, as defined above, applied thereto.

The present invention is explained in greater detail by the following examples.

EXAMPLES

The one-component, solvent-free organosiloxane compositions were applied using a coating machine from PVA, type PVA350, by means of a valve with a cross-cut nozzle of type XAE. The applications were carried out at room temperature and a nozzle pressure between 0.7 and 4.2 bar. The application rate was between 300 and 450 mm·s$^{-1}$.

Measurements of the rheological parameters such as viscosity and shear rate were carried out using an MCR-302 from Anton Paar.

Example 1

A base mixture of 300 parts by weight of a divinylpolydimethylsiloxane having a viscosity of 50 mPa·s (component A), 30 parts by weight of a polydimethylsiloxane having an Si—H content of 7 mmol/g (component B), 5 parts by weight of 3,5-dimethyl-1-hexyn-3-ol (component D), 0.5 part by weight of a 1% solution of the Karstedt complex in 1,2-divinyltetramethyldisiloxane (component C), and 170 parts by weight of a linear polydimethylsiloxane having a terminal vinyl group and a terminal Si—H unit (component F) is mixed thoroughly. The viscosity of the mixture at 25° C. is 40 mPa·s.

To 96 parts by weight of that mixture there are then added 0.1 part by weight of a diepoxypolysiloxane having a viscosity of 10 mPa·s (component G) and 3 parts by weight of a fumed silica partially coated with dimethylsilane (component E).

The viscosity, measured at 25° C., is then 430,000 mPa·s at a shear rate of 0.01 s$^{-1}$ and 120 mPa·s at a shear rate of 500 s$^{-1}$.

On application according to the above-described method, a uniform coating curtain was obtained and the coating no longer ran on the printed circuit board after application.

Example 2

To 98 parts by weight of the base mixture from Example 1 there are added 0.1 part by weight of a diepoxypolysiloxane having a viscosity of 10 mPa·s (component G) and 1 part by weight of a fumed silica partially coated with dimethylsilane (component E).

The viscosity, measured at 25° C., is then 8000 mPa·s at a shear rate of 0.01 s$^{-1}$ and 120 mPa·s at a shear rate of 11 s$^{-1}$.

On application according to the above-described method, a uniform coating curtain was obtained and the coating no longer ran on the printed circuit board after application.

Example 3

To 97 parts by weight of the base mixture from Example 1 there are added 1 part by weight of a diepoxypolysiloxane having a viscosity of 10 mPa·s (component G) and 2 parts by weight of an uncoated fumed silica (component E).

The viscosity, measured at 25° C., is then 390,000 mPa·s at a shear rate of 0.01 s$^{-1}$ and 120 mPa·s at a shear rate of 400 s$^{-1}$.

On application according to the above-described method, a uniform coating curtain was obtained and the coating no longer ran on the printed circuit board after application.

Example 4

To a mixture of 46 parts by weight of a divinylpolydimethylsiloxane having a viscosity of 50 mPa·s, 46 parts by weight of a divinylpolydimethylsiloxane having a viscosity of 100 mPa·s (component A), 12 parts by weight of a polydimethylsiloxane having an Si—H content of 7 mmol/g (component B), 1 part by weight of 3-methylbut-1-yn-3-ol (component D), 0.2 part by weight of a 1% solution of the Karstedt complex in 1,2-divinyltetramethyldisiloxane (component C), and 68 parts by weight of a linear polydimethylsiloxane having a terminal vinyl group and a terminal Si—H unit (component F) there are added 3 parts by weight of a fumed silica partially coated with dimethylsilane (component E).

The viscosity, measured at 25° C., is then 50,000 mPa·s at a shear rate of 0.01 s$^{-1}$ and 120 mPa·s at a shear rate of 110 s$^{-1}$.

On application according to the above-described method, a uniform coating curtain was obtained and the coating no longer ran on the printed circuit board after application.

Comparative Example 1

A coating consisting of 300 parts by weight of a divinylpolydimethylsiloxane having a viscosity of 50 mPa·s (component A), 30 parts by weight of a polydimethylsiloxane having an Si—H content of 7 mmol/g (component B), 0.66 part by weight of a 20% solution of a triorganophosphite in xylene (component "δ"), 0.1 part by weight of a 1% solution of the Karstedt complex in 1,2-divinyltetramethyldisiloxane (component C) is mixed thoroughly.

The mixture has a viscosity, measured at 25° C., of 3000 mPa·s at a shear rate of 0.01 s$^{-1}$ and 120 mPa·s at a shear rate of 100 s$^{-1}$.

Coating with a cross-cut nozzle according to the above-described method is possible, but the coating spreads and runs extensively over the printed circuit board because the flow anomaly is much too small.

Comparative Example 2

A coating consisting of the constituents of Comparative Example 1 but with an additional 3.5 parts by weight of a fumed silica partially coated with dimethylsilane (component E) in order to increase the flow anomaly has a viscosity, measured at 25° C., of 200,000 mPa·s at a shear rate of 0.01 s$^{-1}$ but also a viscosity of over 120 mPa·s even at shear rates of >1000 s$^{-1}$. For example, the viscosity is 195 mPa·s at a shear rate of 1000 s$^{-1}$. No coating curtain opens on passage through the cross-cut nozzle.

The invention claimed is:

1. One-component, solvent-free organosiloxane composition comprising
   a) from 10 to 98% by weight of at least one linear or branched polyorganosiloxane containing at least two alkenyl or alkynyl groups, as component A;
   b) from 0.1 to 30% by weight of at least one linear or branched polyorganosiloxane containing at least 3 Si—H groups, as component B;
   c) from 0.000001 to 1% by weight of at least one hydrosilylation catalyst as component C;
   d) from 0.00001 to 5% by weight of at least one alkynol of the general formula (I)

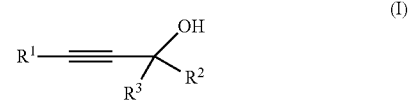

wherein $R^1$, $R^2$, $R^3$ are selected independently of one another from H, $C_1$-$C_6$-alkyl and substituted or unsubstituted $C_3$-$C_6$-cycloalkyl; or $R^1$ is selected from H, $C_1$-$C_6$-alkyl and substituted or unsubstituted $C_3$-$C_6$-cycloalkyl, and $R^2$, $R^3$ are bonded together and form a 3- to 8-membered ring which can be substituted by one or more $C_1$-$C_3$-alkyl groups, as component D;

e) from 0.1 to 5% by weight of at least one fumed silica as component E;

f) from 0 to 89.799989% by weight of one or more polyorganosiloxanes containing two terminal Si—H groups or one terminal Si-H group and one terminal alkenyl group, as component F;

g) from 0 to 20% by weight of one or more polyepoxyorganosiloxanes as component G;

h) from 0 to 30% by weight of one or more acyclic or cyclic organosiloxanes other than component A, having from 1 to 5 Si atoms and containing at least two alkenyl groups, as component H; and i) from 0 to 10% by weight of one or more additives as component I;

wherein the sum of components A to I is 100% by weight.

2. Organosiloxane composition according to claim 1, wherein the viscosity of the organosiloxane composition is not more than 120 mPa·s at a shear rate of 1000 $s^{-1}$ and at least 5000 mPa·s at a shear rate of 0.01 $s^{-1}$.

3. Organosiloxane composition according to claim 1, wherein the organosiloxane composition comprises from 0.0001 to 89.799989% by weight of component F.

4. Organosiloxane composition according to claim 1, wherein component F comprises a polyorganosiloxane of the general formula (II)

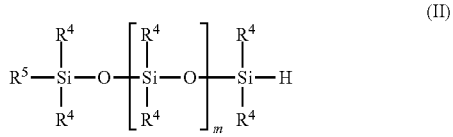

wherein
$R^4$ is selected independently from $C_1$-$C_6$-alkyl,
$R^5$ is selected from H and $C_2$-$C_6$-alkenyl, and
m is a number from 2 to 400.

5. Organosiloxane composition according to claim 1, wherein the organosiloxane composition comprises from 0.0001 to 20% by weight of component G.

6. Organosiloxane composition according to claim 1, wherein component G comprises a polyepoxyorganosiloxane of the general formula (III)

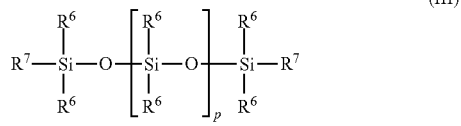

wherein
$R^6$ are selected independently of one another from $C_1$-$C_6$-alkyl and substituted or unsubstituted $C_6$-$C_{12}$-aryl,
$R^7$ is selected from substituted or unsubstituted glycidyloxy-($C_1$-$C_6$-alkyl) and substituted or unsubstituted glycidyloxy-($C_6$-$C_{12}$-aryl); and
p is a number from 2 to 2000.

7. Organosiloxane composition according to claim 1, wherein the organosiloxane composition comprises from 0.0001 to 30% by weight of component H.

8. Organosiloxane composition according to claim 1, wherein component H comprises one or more organosiloxanes selected from the group consisting of 1,2-divinyltetramethyldisiloxane and 1,2,3,4-tetramethyl-1,2,3,4-tetravinyldimethyltricyclosiloxane.

9. Method for applying an organosiloxane protective coating to an electrical or electronic component, comprising the steps
a) providing an organosiloxane composition according to claim 1,
b) applying the organosiloxane composition to the electrical or electronic component by means of a cross-cut nozzle, and
c) heating the electrical or electronic component coated with the organosiloxane composition to a temperature of from 50 to 110° C., whereby the organosiloxane protective coating is formed on the electrical or electronic component by hydrosilylation reaction.

10. Method according to claim 9, wherein the organosiloxane composition is applied in such a manner that an organosiloxane protective coating having a layer thickness of from 0.1 to 250 µm forms.

11. Method according to claim 9, wherein the organosiloxane composition is applied in step b) to a printed circuit board.

12. A method of use of an organosiloxane composition according to claim 1 comprising the step of applying an organosiloxane composition to an electrical or electronic component by means of a cross-cut nozzle.

13. A method of use according to claim 12, wherein the electrical or electronic component is a printed circuit board.

14. Organosiloxane protective coating obtained by the method according to claim 9.

15. Organosiloxane protective coating according to claim 14, wherein the protective coating has a layer thickness of from 0.1 to 250 µm.

16. Electrical or electronic component having an applied organosiloxane protective coating according to claim 14.

17. Organosiloxane composition according to claim 2, wherein the organosiloxane composition comprises from 0.0001 to 89.799989% by weight of component F.

18. Method for applying an organosiloxane protective coating to an electrical or electronic component, comprising the steps
a) providing an organosiloxane composition according to claim 2,
b) applying the organosiloxane composition to the electrical or electronic component by means of a cross-cut nozzle, and
c) heating the electrical or electronic component coated with the organosiloxane composition to a temperature of from 50 to 110° C., whereby the organosiloxane protective coating is formed on the electrical or electronic component by hydrosilylation reaction.

19. Method for applying an organosiloxane protective coating to an electrical or electronic component, comprising the steps
a) providing an organosiloxane composition according to claim 3,
b) applying the organosiloxane composition to the electrical or electronic component by means of a cross-cut nozzle, and
c) heating the electrical or electronic component coated with the organosiloxane composition to a temperature of from 50 to 110° C., whereby the organosiloxane protective coating is formed on the electrical or electronic component by hydrosilylation reaction.

20. Method for applying an organosiloxane protective coating to an electrical or electronic component, comprising the steps
 a) providing an organosiloxane composition according to claim 4,
 b) applying the organosiloxane composition to the electrical or electronic component by means of a cross-cut nozzle, and
 c) heating the electrical or electronic component coated with the organosiloxane composition to a temperature of from 50 to 110° C., whereby the organosiloxane protective coating is formed on the electrical or electronic component by hydrosilylation reaction.

21. Organosiloxane composition according to claim 1, wherein e) is from 0.1 to 4% by weight of at least one fumed silica as component E.

22. One-component, solvent-free organosiloxane composition comprising
 a) from 10 to 98% by weight of at least one linear or branched polyorganosiloxane containing at least two alkenyl or alkynyl groups, as component A;
 b) from 0.1 to 30% by weight of at least one linear or branched polyorganosiloxane containing at least 3 Si—H groups, as component B;
 c) from 0.000001 to 1% by weight of at least one hydrosilylation catalyst as component C;
 d) from 0.00001 to 5% by weight of at least one alkynol of the general formula (I)

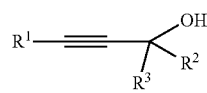

(I)

wherein R$^1$, R$^2$, R$^3$ are selected independently of one another from H, C$_1$-C$_6$-alkyl and substituted or unsubstituted C$_3$-C$_6$-cycloalkyl; or
R$^1$ is selected from H, C$_1$-C$_6$-alkyl and substituted or unsubstituted C$_3$-C$_6$-cycloalkyl, and R$^2$, R$^3$ are bonded together and form a 3- to 8-membered ring which can be substituted by one or more C$_1$-C$_3$-alkyl groups, as component D;
 e) from 0.1 to 10% by weight of at least one fumed silica as component E;
 f) from 0 to 89.799989% by weight of one or more polyorganosiloxanes containing two terminal Si—H groups or one terminal Si—H group and one terminal alkenyl group, as component F;
 g) from 0 to 20% by weight of one or more polyepoxyorganosiloxanes as component G;
 h) from 0 to 30% by weight of one or more acyclic or cyclic organosiloxanes other than component A, having from 1 to 5 Si atoms and containing at least two alkenyl groups, as component H; and
 i) from 0 to 10% by weight of one or more additives as component I;
wherein the sum of components A to I is 100% by weight and wherein the organosiloxane composition comprises from 0.0001 to 20% by weight of component G.

23. One-component, solvent-free organosiloxane composition comprising
 a) from 10 to 98% by weight of at least one linear or branched polyorganosiloxane containing at least two alkenyl or alkynyl groups, as component A;
 b) from 0.1 to 30% by weight of at least one linear or branched polyorganosiloxane containing at least 3 Si-H groups, as component B;
 c) from 0.000001 to 1% by weight of at least one hydrosilylation catalyst as component C;
 d) from 0.00001 to 5% by weight of at least one alkynol of the general formula (I)

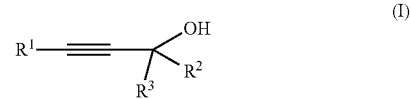

(I)

wherein
R$^1$, R$^2$, R$^3$ are selected independently of one another from H, C$_1$-C$_6$-alkyl and substituted or unsubstituted C$_3$-C$_6$-cycloalkyl; or
R$^1$ is selected from H, C$_1$-C$_6$-alkyl and substituted or unsubstituted C$_3$-C$_6$-cycloalkyl, and R$^2$, R$^3$ are bonded together and form a 3- to 8-membered ring which can be substituted by one or more C$_1$-C$_3$-alkyl groups, as component D;
 e) from 0.1 to 10% by weight of at least one fumed silica as component E;
 f) from 0 to 89.799989% by weight of one or more polyorganosiloxanes containing two terminal Si—H groups or one terminal Si—H group and one terminal alkenyl group, as component F;
 g) from 0 to 20% by weight of one or more polyepoxyorganosiloxanes as component G;
 h) from 0 to 30% by weight of one or more acyclic or cyclic organosiloxanes other than component A, having from 1 to 5 Si atoms and containing at least two alkenyl groups, as component H; and
 i) from 0 to 10% by weight of one or more additives as component I;
wherein the sum of components A to I is 100% by weight and wherein the organosiloxane composition comprises from 0.0001 to 30% by weight of component H.

* * * * *